United States Patent [19]
Nasserbakht

[11] Patent Number: 5,914,640
[45] Date of Patent: Jun. 22, 1999

[54] METHOD AND SYSTEM FOR MATCHING THE INPUT IMPEDANCE OF AN RF AMPLIFIER AN ANTENNA TO IMPEDANCE

[75] Inventor: Gitty N. Nasserbakht, Dallas, Tex.

[73] Assignee: Texas Instruments Incorporated, Dallas, Tex.

[21] Appl. No.: 08/808,626

[22] Filed: Feb. 28, 1997

Related U.S. Application Data

[60] Provisional application No. 60/012,587, Feb. 29, 1996.

[51] Int. Cl.⁶ ...................................................... H03F 1/34
[52] U.S. Cl. .......................... 330/294; 455/291; 455/341
[58] Field of Search .................................. 330/107, 294; 343/701; 455/291, 293, 341

[56] References Cited

U.S. PATENT DOCUMENTS

| | | | |
|---|---|---|---|
| 4,414,690 | 11/1983 | Nordholt et al. | 455/291 X |
| 4,484,147 | 11/1984 | Metz | 330/311 X |
| 5,159,289 | 10/1992 | Zametzer et al. | 330/294 |
| 5,488,382 | 1/1996 | Fenzi et al. | 343/701 X |

*Primary Examiner*—James B. Mullins
*Attorney, Agent, or Firm*—Ronald O. Neerings; W. James Brady; Richard L. Donaldson

[57] ABSTRACT

A low noise RF input amplifier circuit has an input impedance $Z_{IN}$ for matched-impedance coupling to an antenna having a resistive impedance $R_A$. The amplifier circuit has an input and output nodes, an inverting amplifier, and a feedback capacitor. The input node receives an antenna signal which the inverting amplifier amplifies by a frequency-dependent gain $-A(s)$ approaching $-A_0$ at low complex frequencies s. The feedback capacitor C couples the output node to the input node for negative feedback and is selected to match $Z_{IN}$ to $R_A$. When the amplifier's gain $A(s)$ has a rolloff approximated by $$A(s) \approx \frac{A_0}{1 - \frac{s}{p_1}}$$

where $p_1$ is a negative pole, the capacitance of C which matches $Z_{IN}$ to $R_A$ is approximately inversely proportional to both $(A_0+1)$ and $R_A$.

15 Claims, 1 Drawing Sheet

METHOD AND SYSTEM FOR MATCHING THE INPUT IMPEDANCE OF AN RF AMPLIFIER AN ANTENNA TO IMPEDANCE

This application claims benefit under 35 USC §119(e)(1) of copending provisional application 60/012,587 filed Feb. 29, 1996.

FIELD OF THE INVENTION

This invention is related to signal amplification, and more particularly to a method and apparatus for amplifying radio frequency signals.

BACKGROUND OF THE INVENTION

Telephonic communications are increasingly being conducted through wireless radio frequency (RF) broadcast rather than wire conduction. For example, both cordless and cellular telephones communicate with stationary transmitters via RF broadcast signals.

A wireless telephone handset contains an RF transmitter and receiver, and an RF antenna. The antenna receives an RF signal and conducts it to the receiver, which amplifies and demodulates it to produce an audio output signal for the handset's earpiece. To optimize the amplification of the signal, the amplifier's input impedance must be matched with that of the antenna or front-end RF filter (typically a resistance of 50 ohms). Input impedance-matching prevents signal reflection and delivers maximum input signal power to the amplifier. Preferably, such impedance-matching should be accomplished without introducing noise into the RF signal from the antenna.

Several methods of matching the input impedance of an amplifier to an antenna impedance have been devised. One such method is to use a shunt feedback resistor for negative feedback. Suppose an inverting amplifier has a high input impedance and produces a signal gain -A. If a feedback resistor with resistance $R_F$ is connected from the amplifier's output to its input, then the input impedance of the amplifier circuit will become approximately $$Z_{IN} = \frac{R_F}{1 + A} \qquad \text{(Eq. 1)}$$

By choosing a proper value of $R_F$, the impedance of the antenna can be matched across a wide band of signal frequencies. However, the feedback resistor introduces an undesirable level of thermal noise into the RF signal.

Another method of impedance-matching is to connect a network of lossless passive elements such as inductors and capacitors (a "matching network") to the amplifier input stage. This allows impedance-matching across a selected narrow band of signal frequencies, which is sufficient for most telecommunications applications. However, since high quality inductors cannot easily be formed on a silicon integrated circuit chip, such a matching network cannot be formed on the same integrated circuit chip as the amplifier and other signal processing electronics. This is due to the thermal loss (heat generation) associated with on-chip inductors, which adds to the noise of the receiver. This creates a necessity for external or off-chip circuit components, which increases both the size and the cost of the signal processing system.

Thus, it is desirable to have a method of matching the input impedance of an amplifier with the resistive impedance of an antenna or RF filter using an integrated circuit component. It is also desirable to accomplish the impedance-matching without introducing noise into the amplified signal.

SUMMARY OF THE INVENTION

My invention provides an amplifier circuit for amplifying RF signals in which the input impedance of the RF amplifier system can easily be matched with the impedance of an RF antenna or other device. It has an inverting amplifier for receiving an input signal at an input node and generating an inverted output signal at an output node, and a shunt feedback capacitor connected from the output node to the input node, for controlling the system's input impedance by negative feedback.

One advantage of my invention is that the system's input impedance can easily be matched with the resistive impedance of an RF antenna or other device. A further advantage is that this impedance-matching is accomplished with on-chip integrated circuit components, eliminating expensive off-chip components. Yet another advantage is that such impedance-matching doesn't introduce thermal noise into the amplified signal.

DETAILED DESCRIPTION

Figure 1:
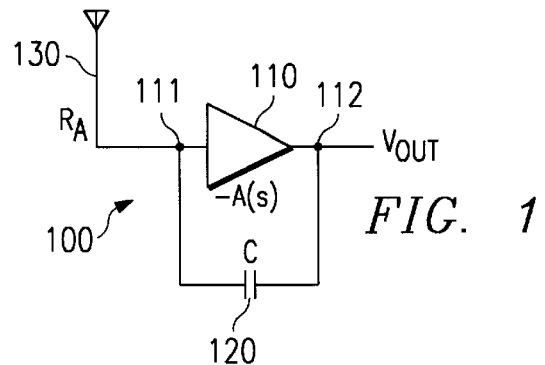
FIG. 1 is a simplified diagram of an impedance-matching feedback system in accordance with the invention.

FIG. 1 shows a circuit 100 for achieving a desired input impedance for an RF amplifier according to the teachings of my invention. The system has an input node 111 for receiving an RF signal from an antenna 130 having a resistive antenna impedance $R_A$. Inverting amplifier 110 has a frequency-dependent gain -A(s), where s is the complex frequency variable. Amplifier 110 is coupled to receive input signals from input node 111 and output them with gain -A(s) to an output node 112. Assuming that the amplifier's response can be approximated by a one-pole rolloff, A(s) is given by:

$$A(s) \approx \frac{A_0}{1 - \frac{s}{p_1}} \qquad \text{(Eq. 2)}$$

where $A_0$ is the low-frequency gain of the amplifier 110, and $p_1$ is the value of s at the pole. By convention, $p_1$ is negative.

A capacitor 120 with capacitance C is connected between the input node 111 and the output node 112 of the amplifier 110 for negative feedback. Circuit 100 has an input impedance $Z_{IN}$ which can be approximated by $$Z_{IN} \approx \frac{1}{sC[1 + A(s)]} \qquad \text{(Eq. 3)}$$

Using equation (2) for A(s), the input impedance is approximately $$Z_{IN}(S) \approx \frac{1 - \frac{s}{p_1}}{sC(1 + A_0)\left[1 - \frac{s}{p_1(1 + A_0)}\right]} \quad \text{(Eq. 4)}$$

Assuming the low-frequency gain $A_0$ to be much greater than unity, there is a frequency range in which $$p_1 << s << p_1(1+A_0) \quad \text{(Eq. 5)}$$

In this frequency range, equation (3) can be approximated by $$Z_{IN} \approx \frac{-1}{Cp_1(1 + A_0)} \quad \text{(Eq. 6)}$$

Thus, in this frequency range, the input impedance is resistive and does not vary significantly with the signal frequency.

By choosing appropriate values of C, $A_0$, and $p_1$, equation (5) can be made applicable in any selected range of frequencies, and the input impedance of circuit 100 as expressed in equation (6) can be made to match the resistive impedance of an antenna 130 or other device. Moreover, this impedance-matching is accomplished with an inexpensive, on-chip capacitor, which does not introduce thermal noise into the amplifier output signal as an actual feedback resistor would.

Although the above derivation is shown for a wideband amplifier with low pass characteristics, the same concept can be applied to tuned amplifiers.

Figure 2:
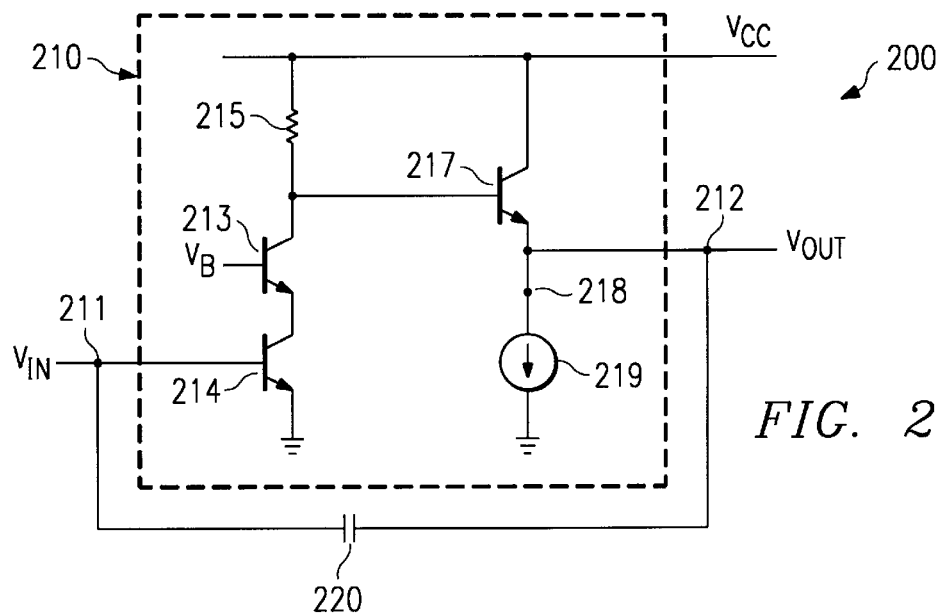
FIG. 2 is a schematic of a first emodiment of a feedback system in accordance with the invention.

A circuit 200 constructed according to the teachings of my invention is shown in FIG. 2. Circuit 200 includes an input node 211, an inverting amplifier 210 feeding an output node 212, and a capacitor 220 coupling the output node to the input node for negative feedback. Inverting amplifier 210 has a cascode amplifier stage which provides high gain and low noise, followed by an emitter follower stage for low output impedance. The cascode amplifier has a grounded-emitter input transistor 214 for gain followed by AC-grounded-base transistor 213 whose collector is coupled to supply voltage $V_{CC}$ by a load resistor 215. The output of the cascode amplifier at the collector of transistor 213 is fed to the base of an output transistor 217 whose collector is connected to supply voltage $V_{CC}$ and whose emitter is biased by a current source 219 to form the emitter follower.

For AC-grounding, the base of transistor 213 receives a constant bias voltage $V_B$ set a few volts above transistor 214's emitter voltage to pin 214's collector and keep 214 in the active region.

In operation, an input signal $V_{IN}$ is received on the input node 211 and the base of input transistor 214. Transistor 213 receives a constant bias voltage $V_B$ at its base. Variations in $V_{IN}$ cause the current conducted by transistors 213 and 214 to fluctuate. This causes the voltage at the base of output transistor 217 to fluctuate due to the varying voltage drop across resistor 215. As a result, the voltage on output node 212 ($V_{OUT}$) fluctuates with the base voltage of transistor 217. Capacitor 220 provides shunt negative feedback. In some implementations, the cascode amplifier stage may be removed. In other implementations, the emitter-follower circuit comprising of transistor 217 and current source 219 may be removed, and capacitor 220 may be connected directly to node 218. Thus, when $V_{IN}$ increases, $V_{OUT}$ decreases, and vice versa.

Figure 3:
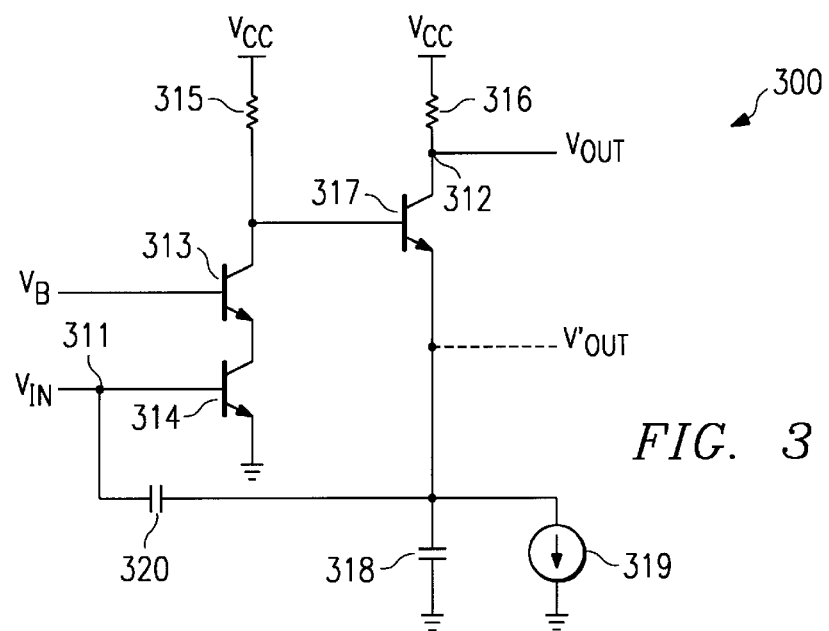
FIG. 3 is a schematic of a second embodiment of a feedback system in accordance with the invention.

FIG. 3 shows an alternative embodiment of my invention. In this embodiment, circuit 300 has an input node 311, an output node 312, a cascode transistor 313, an input transistor 314, collector resistors 315 and 316, an output transistor 317, a capacitor 318, a current source 319, and a feedback capacitor 320.

The base of input transistor 314 is connected to input node 311 of amplifier 310, its emitter is connected to ground, and its collector is connected to the emitter of cascode transistor 313.

The base of cascode transistor 313 receives a constant bias voltage $V_B$, and its collector is connected to collector resistor 315 and the base of output transistor 317. Resistor 315 connects the transistor 313's collector to supply voltage $V_{CC}$.

Output transistor 317 has its collector connected to supply voltage $V_{CC}$ by resistor 316. The collector of output transistor 317 is also connected to output node 312 of amplifier 319. The emitter of transistor 317 is connected to current source 319 and a charge plate of capacitor 318. Current source 319 and a second charge plate of capacitor 318 are connected to ground. A feedback capacitor 320 is connected between input node 311 of amplifier 310 and the emitter of output transistor 317.

Circuit 300 operates similar to circuit 200 shown in FIG. 2 except for the shunt-series feedback of the negative feedback network. An input signal $V_{IN}$ is received on the input node 311 and the base of input transistor 314. Cascode transistor 313 receives a constant bias voltage $V_B$ at its base. Variations in $V_{IN}$ cause the current conducted by transistors 313 and 314 to fluctuate. This causes the voltage at the base of output transistor 317 to fluctuate, which in turn causes the collector current conducted by transistor 317 to fluctuate. As the collector current fluctuates, the voltage at output node 312, which is equal to $V_{CC}$ minus the voltage drop across resistor 316, also fluctuates. Capacitors 320 and 318 provide negative shunt-series feedback. Thus, when $V_{IN}$ increases, $V_{OUT}$ increases, and vice versa.

A comparison of FIG. 3 with FIGS. 1 and 2 reveals that capacitor 320 is not connected to the final output of the amplifier, $V_{OUT}$; rather it is connected to node $V'_{OUT}$. It should be noted that for input impedance consideration, it is important that the feedback capacitor be connected in shunt at the input, between the input of the amplifier and an output node that provides the appropriate amplifications given by equation (2). Lateral output node $V'_{OUT}$ satisfies this condition.

Therefore, equations (4)–(6) are valid approximations for the behavior of the circuit. By choosing appropriate values for the components of circuit 300 so as to achieve an appropriate gain and rolloff, and an appropriate capacitance for feedback capacitor 320, the input impedance of circuit 300 can be matched with the impedance of an RF reception antenna or other device (not shown).

Although my invention and its advantages have been described in detail, it should be understood that various changes, substitutions and alterations can be made therein without departing from the spirit and scope of the invention as defined by the appended claims. For example, although the invention is illustrated with circuits built with bipolar transistors, the invention can also be practiced with circuits built with other types of transistors, such as unipolar (MOS) transistors.

I claim:

1. An RF amplifier system, with a desired input impedance for amplifying RF signals, the system comprising:

an amplifier for receiving an input signal at an input node of the amplifier; and a feedback capacitor for controlling the input impedance of the RF amplifier system, the capacitor having a first charge plate electrically connected to the input node of the amplifier and a second charge plate electrically connected to an output node of the amplifier, and wherein the amplifier further comprises:

an input transistor having base, emitter, and collector terminals, the base terminal being electrically connected to the input node of the amplifier, the collector terminal conducting a first transistor current in response to the input signal;

a first collector resistor having a first terminal electrically connected to a constant voltage source, the collector resistor conducting a first resistor current, the first resistor current being substantially equal to the first transistor current;

an output transistor having base, emitter, and collector terminals, the base terminal being electrically connected to a second terminal of the first collector resistor, the emitter terminal being electrically connected to the output node of the amplifier, the collector terminal being electrically connected to the constant voltage source;

a bias transistor having base, emitter, and collector terminals, the base terminal being electrically connected to a bias voltage source, the emitter terminal being electrically connected to the collector terminal of the input transistor, the collector terminal of the bias transistor being electrically connected to the second terminal of the first collector resistor;

a ground capacitor having first and second charge plates, the first charge plate being electrically connected to a ground potential, the second charge plate being electrically connected to the emitter terminal of the output transistor; and a current source for conducting a constant current from the emitter terminal of the output transistor and the second charge plate of the ground capacitor to the ground potential.

2. The RF amplifier system of claim 1, wherein said input signal is an antenna signal from an antenna, and said amplifier amplifies the antenna signal by a frequency-dependent gain $-A(s)$ approaching $-A_0$ at low complex frequencies s.

3. The RF amplifier system of claim 2 wherein the capacitance of the feedback capacitor matches an amplifier input impedance $Z_{IN}$ to a resistive impedance $R_A$ of said antenna, and is approximately inversely proportional to both $(A_0+1)$ and $R_A$.

4. The RF amplifier system of claim 2 wherein said amplifier amplifies the antenna signal by a frequency-dependent gain $-A(s)$ approaching $-A_0$ at low complex frequencies s, and the gain $A(s)$ has a rolloff approximated by $$A(s) = \frac{A_0}{1 - \frac{s}{p_1}}$$

where $p_1$ is a negative pole.

5. The RF amplifier system of claim 4 wherein the capacitance of said feedback capacitor is also approximately inversely proportional to $p_1$.

6. The RF amplifier system of claim 4 wherein the capacitance of said feedback capacitor is approximately given by $$C = \frac{-1}{R_A p_1 (1 + A_0)}.$$

7. The RF amplifier system of claim 2 wherein an input impedance $Z_{IN}$ of said amplifier can be matched to a resistive impedance $R_A$ of said antenna when $$p_1 \ll s \ll p_1(1+A_0).$$

8. The RF amplifier system of claim 1 wherein said amplifier is an inverting amplifier having a high gain and low noise.

9. The RF amplifier system of claim 1 formed as an integrated circuit on a single substrate.

10. A telecommunications system, comprising:

an RF amplifier system having an amplifier for receiving an input signal and for generating an output signal in proportion to the input signal, the amplifier comprising:

an output node and an input node for receiving the input signal;

a feedback capacitor for controlling the input impedance of the RF amplifier circuit, the feedback capacitor having a first charge plate electrically connected to the input node of the amplifier;

an input transistor having base, emitter, and collector terminals the base terminal being electrically connected to the input node of the amplifier, the collector terminal conducting a first transistor current in response to the input signal;

a first collector resistor having a first terminal electrically connected to a constant voltage source, the collector resistor conducting a first resistor current, the first resistor current being substantially equal to the first transistor current;

an output transistor having base, emitter, and collector terminals, the base terminal being electrically connected to a second terminal of the first collector resistor, the collector terminal being electrically connected to the output node to the amplifier, the emitter terminal being electrically connected to a second charge plate of the feedback capacitor;

a second collector resistor having first and second terminals, the first terminal being electrically connected to the constant voltage source, the second terminal being electrically connected to the collector terminal of the output transistor;

a bias transistor having base, emitter, and collector terminals, the base terminal being electrically connected to a bias voltage source, the emitter terminal being electrically connected to the collector terminal of the input transistor, the collector terminal of the bias transistor being electrically connected to the second terminal of the first collector resistor;

a ground capacitor having first and second charge plates, the first charge plate being electrically connected to a ground potential, the second charge plate being electrically connected to the emitter terminal of the output transistor;

a current source for conducting a constant current from the emitter terminal of the output transistor and the second charge plate of the ground capacitor to the ground potential; and an antenna, electrically connected to the input node of the amplifier, for receiving a broadcast of the input signal and for conducting the input signal to the input node of the amplifier.

11. The system of claim 10, wherein the feedback capacitor has a capacitance, and wherein the amplifier has a low-frequency amplification and a rolloff frequency, and wherein the RF amplifier circuit has an input impedance dependent on the capacitance of the capacitor and the low-frequency amplification and rolloff frequency of the amplifier.

12. The system of claim 11, wherein the antenna has a characteristic impedance, and wherein the capacitance of the feedback capacitor and the low-frequency amplification and rolloff frequency of the amplifier are such that the input impedance of the RF amplifier circuit is approximately equal to the characteristic impedance of the antenna.

13. The system of claim 10, wherein the RF amplifier circuit is formed as an integrated circuit on a single substrate.

14. A method for amplifying RF signals with a desired input impedance, comprising the steps of:

providing an input signal;

providing an amplifier for receiving the input signal at an input node, and for generating an amplified output signal at an output node; and providing a feedback capacitor for controlling an input impedance for the input signal at the input node of the amplifier, the step of providing the amplifier further comprises the steps of:

providing an input transistor having base, emitter, and collector terminals the base terminal being electrically connected to the input node of the amplifier, the collector terminal conducting a first transistor current in response to the input signal;

providing a first collector resistor having a first terminal electrically connected to a constant voltage source, the collector resistor conducting a first resistor current, the first resistor current being substantially equal to the first transistor current;

providing an output transistor having base, emitter, and collector terminals, the base terminal being electrically connected to a second terminal of the first collector resistor, the collector terminal being electrically connected to the output node to the amplifier, the emitter terminal being electrically connected to a second charge plate of the feedback capacitor;

providing a second collector resistor having first and second terminals, the first terminal being electrically connected to the constant voltage source, the second terminal being electrically connected to the collector terminal of the output transistor;

providing a bias transistor having base, emitter, and collector terminals, the base terminal being electrically connected to a bias voltage source, the emitter terminal being electrically connected to the collector terminal of the input transistor, the collector terminal of the bias transistor being electrically connected to the second terminal of the first collector resistor;

providing a ground capacitor having first and second charge plates, the first charge plate being electrically connected to a ground potential, the second charge plate being electrically connected to the emitter terminal of the output transistor; and providing a current source for conducting a constant current from the emitter terminal of the output transistor and the second charge plate of the ground capacitor to the ground potential.

15. The method of claim 14, wherein the steps of providing the amplifier and the feedback capacitor further comprise the step of forming the amplifier and the feedback capacitor as an integrated circuit on a single substrate.

* * * * *

UNITED STATES PATENT AND TRADEMARK OFFICE
CERTIFICATE OF CORRECTION

PATENT NO. : 5,914,640
DATED : June 22, 1999
INVENTOR(S) : Gitty N. Nasserbakht

It is certified that error appears in the above-identified patent and that said Letters Patent is hereby corrected as shown below:

On the title page, the title "METHOD AND SYSTEM FOR MATCHING THE INPUT IMPEDANCE OF AN RF AMPLIFIER AN ANTENNA TO IMPEDANCE" is incorrect.

Instead the title should read -- METHOD AND SYSTEM FOR MATCHING THE INPUT IMPEDANCE OF AN RF AMPLIFIER TO AN ANTENNA IMPEDANCE --.

Signed and Sealed this

Ninth Day of May, 2000

*Attest:*

Q. TODD DICKINSON

*Attesting Officer*     *Director of Patents and Trademarks*